(12) United States Patent
Hu

(10) Patent No.: US 9,685,429 B2
(45) Date of Patent: Jun. 20, 2017

(54) STACKED PACKAGE-ON-PACKAGE MEMORY DEVICES

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 137 days.

(21) Appl. No.: 14/671,623

(22) Filed: Mar. 27, 2015

(65) Prior Publication Data

US 2016/0035711 A1     Feb. 4, 2016

Related U.S. Application Data

(63) Continuation-in-part of application No. 14/445,574, filed on Jul. 29, 2014, now abandoned.

(51) Int. Cl.

| H01L 25/18 | (2006.01) |
|---|---|
| H01L 25/10 | (2006.01) |
| H05K 1/14 | (2006.01) |
| H01L 23/498 | (2006.01) |
| H01L 23/00 | (2006.01) |

(52) U.S. Cl.
CPC ............ H01L 25/18 (2013.01); H01L 25/105 (2013.01); H05K 1/14 (2013.01); H01L 23/49811 (2013.01); H01L 24/13 (2013.01); H01L 24/16 (2013.01); H01L 2224/131 (2013.01); H01L 2224/13147 (2013.01); H01L 2224/16227 (2013.01); H01L 2224/16237 (2013.01); H01L 2224/16238 (2013.01); H01L 2224/81447 (2013.01); H01L 2225/1023 (2013.01); H01L 2225/1058 (2013.01); H01L 2924/15311 (2013.01)

(58) Field of Classification Search
CPC . H01L 2224/32145; H01L 2924/15311; H01L 2224/16145; H01L 2224/48145; H01L 25/0657; H01L 2924/01029; H01L 2924/014; H01L 25/50; H01L 2224/48091; H01L 2224/96; H01L 24/13; H01L 24/16; H01L 2225/1058
See application file for complete search history.

(56) References Cited

U.S. PATENT DOCUMENTS

2015/0113356 A1*  4/2015  Ken ............... G11C 11/005
                                                714/764

* cited by examiner

*Primary Examiner* — Roy Potter
(74) *Attorney, Agent, or Firm* — Hauptman Ham, LLP

(57) ABSTRACT

3D Stacked memory devices with copper pillars electrically connecting the package units are disclosed. A stacked package-on-package memory device includes a base chip package unit having a logic processing chip disposed on a base substrate; and a memory chip stack overlying the base chip unit. The memory chip stack includes a stack of packaged memory units. Each packaged memory unit including a memory chip on an IC substrate. Copper pillars are disposed on the back side of the IC substrate and electrically connected to the base substrate.

20 Claims, 15 Drawing Sheets

STACKED PACKAGE-ON-PACKAGE MEMORY DEVICES

This application is a continuation-in-part application of U.S. application Ser. No. 14/445,574 filed Jul. 29, 2014 the disclosure of which is incorporated by reference herein in its entirety.

BACKGROUND

Technical Field

The present disclosure relates to three dimensional (3D) stacked memory devices, and more particularly, to 3D stacked package-on-package memory devices with copper pillars electrically interconnecting the package units thereof.

Description of Related Art

Three dimensional package-on-package (PoP) technologies for logic device plus memory stacks include an integrated circuit packaging to vertically combine a logic device or a memory controller and a memory package stack which contain high capacity or combination memory devices. The memory package stack includes two or more packages which are installed atop each other with direct vertical chip connection using through silicon via (TSV) to route signals therebetween. This allows higher performance and component density in handheld devices, such as mobile phones, personal digital assistants (PDA), and digital cameras.

In general, cost for 3D DRAM packages increases by using expensive TSV staking. TSV technologies utilizing vertical vias in the silicon wafers are used to interconnect each of the chips. Using through silicon vias substantially results in shortened interconnect length, improved electrical performance, and reduced power consumption by the memory device.

Alternatively, 3D memory stack with copper pillar interconnections uses solder bumps with plating a lead-free solder cap on top of the copper pillar. Requirements for developing 3D stack with copper pillar interconnections lead to new package technologies, particularly replacing wire bonding in many higher end devices that require high I/O density, low production cost and small area packaging.

SUMMARY

To achieve one or more objectives, 3D stacked memory devices with copper pillars electrically connecting the PoP memory units are provided. By using copper pillar via, high performance, high I/O density, low fabrication cost, and small area packaging can be achieved.

According to an aspect, a stacked package-on-package memory device comprises a base chip package unit having a logic processing chip disposed on a base substrate and at least one stacked memory package unit overlying the base chip package unit. The at least one stacked memory package unit includes a memory chip on an IC substrate. Copper pillars are disposed on the back side of the IC substrate and electrically connected to the base substrate.

In some embodiments, the memory chip includes a DRAM chip, a mobile DRAM chip, a low power DDR (LPDDR) chip, a high bandwidth memory (HBM) chip, a hybrid memory cube (HMC) chip, and a Wide I/O2 chip, etc. Besides on top of the dielectrics, copper traces or pads are fully or partially embedded into a dielectric layer on the base substrate. The copper traces or pads have surfaces finished for protection during structure assembly.

According to another aspect, a stacked package-on-package memory device comprises a base chip package unit having a logic processing chip disposed on a base substrate and a memory chip stack overlying the base chip unit. The memory chip stack includes a stack of packaged memory units, each packaged memory unit comprising a memory chip on an IC substrate. Copper pillars are disposed on the back side of the IC substrate and electrically connected to the base substrate.

According to another aspect, a stacked package-on-package memory device comprises a main circuit board with through via and interconnections therein, a logic processing chip disposed on the main circuit board, and a memory chip stack disposed side-by-side with the logic processing chip on the main circuit board, wherein the memory chip stack includes a stack of packaged memory units, each packaged memory unit comprising a memory chip on an IC substrate, and wherein copper pillars are disposed on the back side of the IC substrate and electrically connected to the base substrate.

BRIEF DESCRIPTION OF THE DRAWING

The foregoing aspects and many of the attendant advantages will become more readily appreciated as the same becomes better understood by reference to the following detailed description, when taken in conjunction with the accompanying pictures, wherein.

DETAILED DESCRIPTION

Figure 1:
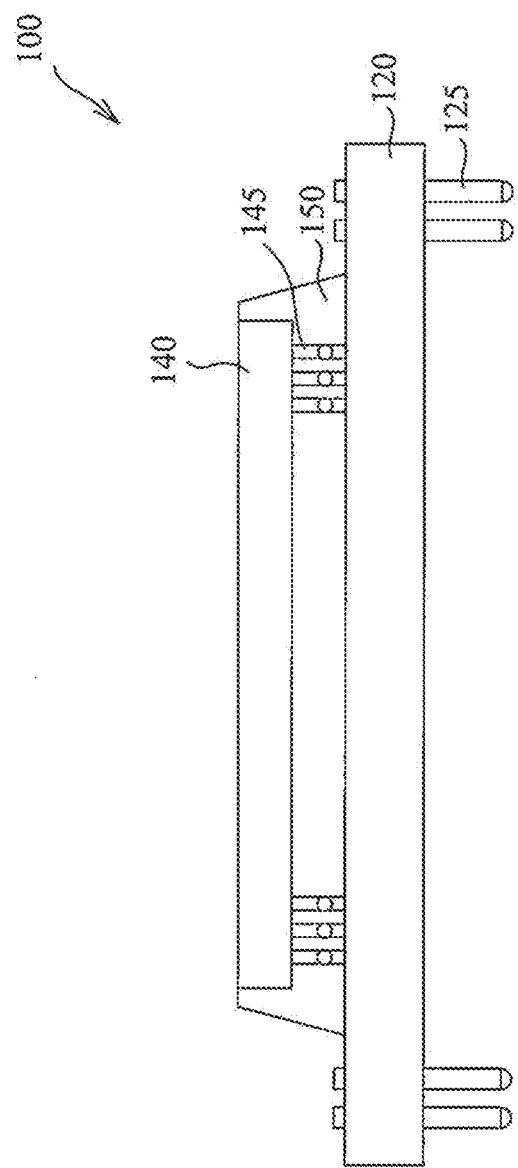
FIG. 1 illustrates a side view of a memory chip package for a package-on-package memory device in accordance with an embodiment of the invention.

Reference will now be made in detail to the present preferred embodiments of the invention, examples of which are illustrated in the accompanying drawings. Wherever possible, the same reference numbers are used in the drawings and the description to refer to the same or like parts. In the drawings, the shape and thickness of an embodiment may be exaggerated for clarity and convenience. This description will be directed in particular to elements forming part of, or cooperating more directly with, apparatus in accordance with embodiments of the present invention. It should be noted that the features illustrated in the drawings are not necessarily drawn to scale, and like reference numerals represent the same or similar elements. The devices, elements, and methods in the following description are configured to illustrate embodiments of the present invention, and should not be construed in a limiting sense.

3D stacked memory packages comprising very low profile packages combine independent logic devices and memory package units stacked one on top of the other. Switching from a single PoP memory device to 3D memory stack using copper pillar interconnections will enable high I/O density, low production cost, and reduction of both package size and power consumption. Embodiments of the present invention disclose 3D stacked package-on-package memory devices with copper pillars electrically interconnecting the package-on-package device units.

FIG. 1 illustrates a perspective view of a memory chip package for a package-on-package memory device in accordance with an embodiment of the invention. Referring to FIG. 1, a memory chip package unit 100 comprises a memory chip 140 disposed overlying an IC substrate 120. Copper pillars 125 are disposed on the back side of the IC substrate and electrically connected to the base substrate. The copper pillar's critical features and physical properties are considerations for ensuring a high quality, reliable bump structure. It is beneficial that with fine copper pillar pitches below 100 um, the placement accuracy of the die to substrate is a consideration for high yield manufacturing.

While the exemplary embodiment is described in conjunction with a low power mobile DRAM chip, the features of the memory chip 140 may also be applied to other memory chips, such as a DDR chip, a high bandwidth memory (HBM) chip, a hybrid memory cube (HMC) chip and a wide I/O memory chip. In some embodiments, the IC substrate or IC package is not limited to memory chips, and is applicable to other types of ICs or chips.

Electrical interconnection components 145 including copper bumps of the memory chip 140 jointing copper traces or pads on the IC substrate 120 are interposed between the memory chip 140 and the IC substrate 120. The copper traces or pads are fully or partially embedded into a dielectric layer on the base substrate. The copper traces or pads have surfaces finished for protection during structure assembly. Alternatively, the copper trace or the copper pad protrudes out of the IC substrate.

To further reduce the height of the memory chip package unit 100, the memory chip can be further thinned down by grinding or polishing. A mold encapsulation 150 can be implemented on the memory chip 140 such that a thin die and mold cap are formed. In one embodiment, through mold vias (not shown) filled with copper can be alternatively formed as electrical connections.

Figure 2:
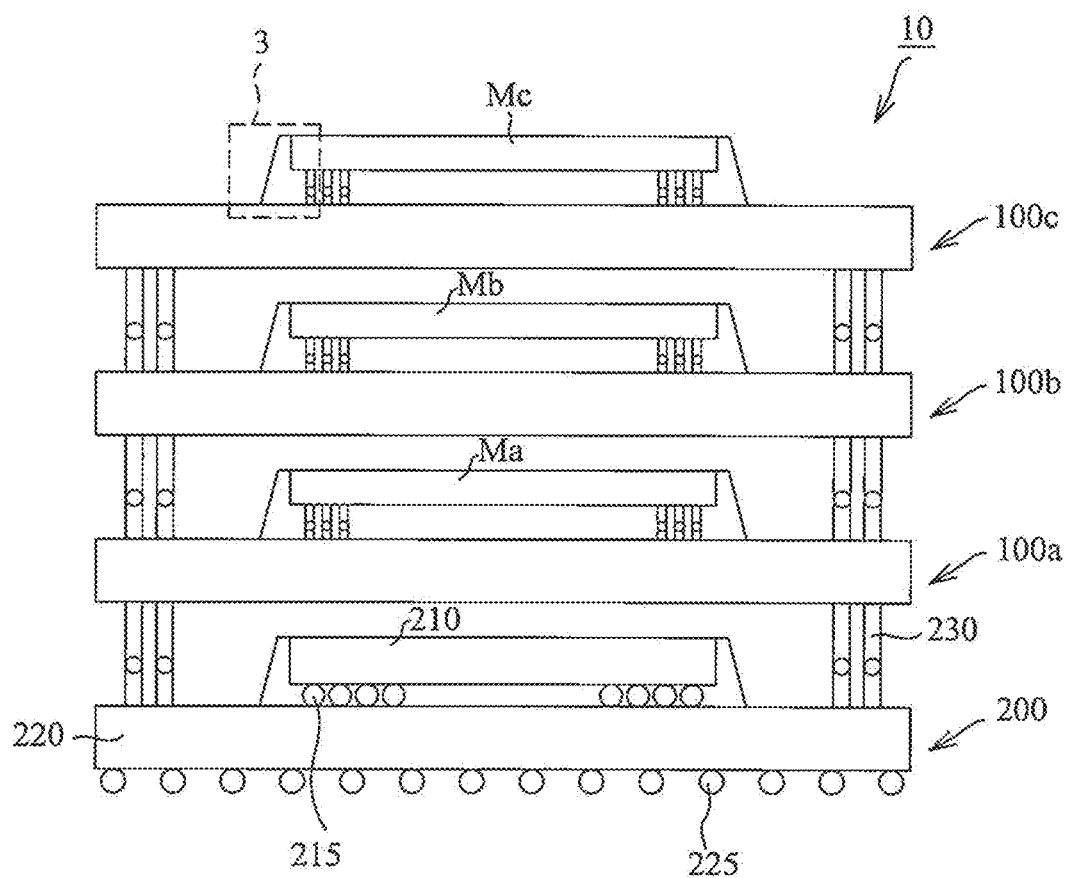
FIG. 2 schematically illustrates an embodiment of the stacked package-on-package memory devices with copper pillars electrically connecting the package units.

FIG. 2 schematically illustrates an embodiment of the stacked package-on-package memory devices with copper pillars electrically connecting the package units. According to an embodiment of the present invention, vertical integration of stacked DRAM with copper pillars and a logic device in a BGA package can be successfully achieved. A stacked package-on-package memory device 10 comprises a base chip package unit 200 having a logic processing chip 210 disposed on a base substrate 220 and at least one memory chip package unit 100a-100c stacked overlying the base chip package unit 200. Copper pillars 230 are disposed on the back side of the IC substrate and electrically connected to the base substrate 220. The logic processing chip preferably includes an application processor and a memory control unit.

Figure 3A:
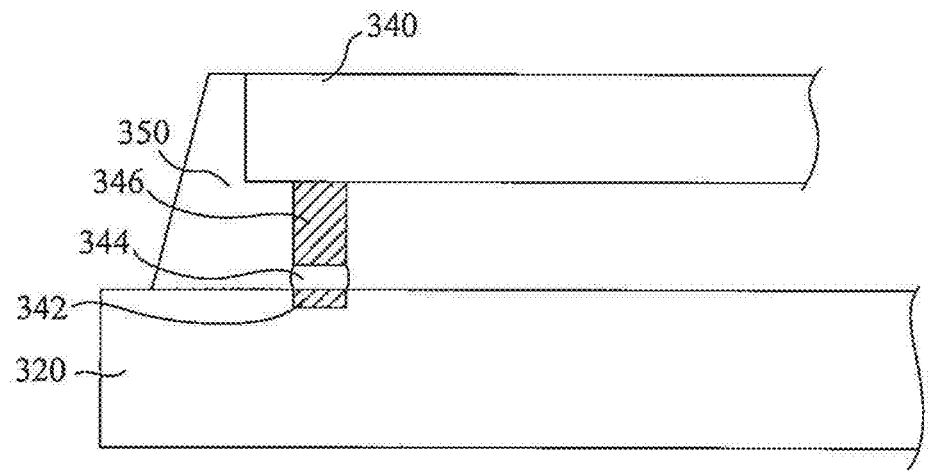
FIG. 3A and FIG. 3B schematically illustrate alternative embodiments of implement bond on lead (BOL) interconnection in accordance with the present invention.
Figure 3B:
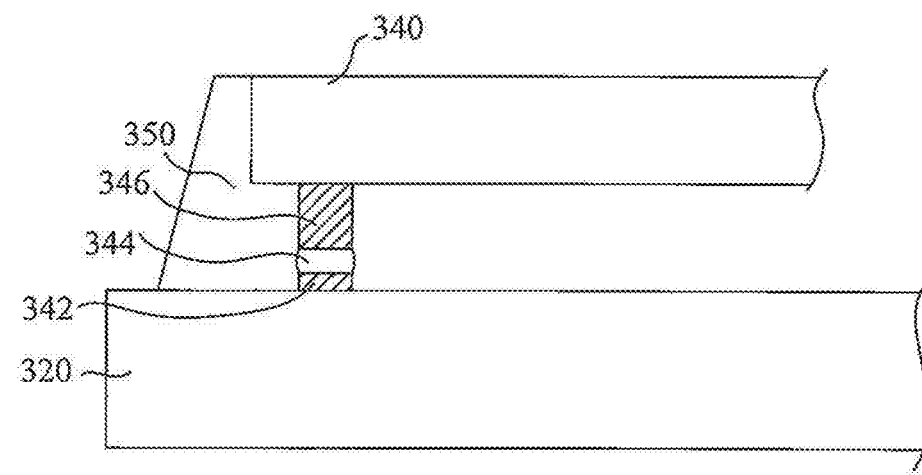

The base chip package unit 200 comprises an array of solder balls 215, or other interconnecting arrangement such as C4 (controlled collapse chip connection) balls or the interconnecting arrangements described with respect to FIGS. 3A-3B, on the top surface of the base substrate 220 for mounting the logic processing chip 210. The base chip package unit 200 further comprises an array of solder balls 225 on the bottom surface of the base substrate 220. There are additional features not mentioned here, which complete the stacked package-on-package memory device 10.

According to embodiments of the present invention, there at least two varieties of copper interconnections. One of the copper interconnections is memory chip to IC substrate interconnections. Electrical interconnection components 145 including copper bumps of the memory chip 140 jointing copper traces or pads on the IC substrate 120 are interposed between the memory chip 140 and the IC substrate 120. The copper traces or pads are fully or partially embedded into a dielectric layer on the base substrate 220. The copper traces or pads have surfaces finished for protection during structure assembly. Alternatively, the copper trace or the copper pad protrudes out of the IC substrate. The other copper interconnection is package to package interconnections. Copper pillars 125 are disposed on the back side of the IC substrate 120 and electrically connected to the IC substrate or base substrate of other package units.

The I/O pad locations are considerations for stacked memory packaging. For example, arrangement of I/O pads for low power mobile DRAM is different from those for other DRAM chips. The I/O pads for low power mobile DRAMs are distributed as a line-by-line architecture at both the peripheral ends of the memory chip. It would be preferable in some embodiments to implement bond on lead (BOL) interconnection in the mobile DRAM packaging architecture. BOL interconnection comprising attachment of bumps to narrow pads or traces allows finer effective pitch.

FIG. 3A and FIG. 3B show an enlarge view of a region 3 of FIG. 2, schematically illustrating alternative embodiments of implementing bond on lead (BOL) interconnection in accordance with the present invention. Electrical interconnection components, including solder 344 jointing copper bumps 346 of the memory chip 340 to copper traces or pads 342 on the IC substrate 320, are interposed between the memory chip 340 and the IC substrate 320. In one embodiment, the copper traces or pads 342 are fully or partially embedded into a dielectric layer on the base substrate as shown in FIG. 3A. The copper traces or pads have surfaces finished for protection during structure assembly. Alternatively, the copper trace or the copper pad protrudes out of the IC substrate as shown in FIG. 3B. A mold encapsulation 350 is formed between the memory chip 340 and the IC substrate 320.

According to embodiments of the present invention, a 3D stacked memory device including multilevel package-on-package (PoP) assembly is provided. The 3D stacked memory device includes a base chip package unit having a logic processing chip (or a memory controller chip) disposed on a base substrate and a memory chip stack overlying the base chip unit. The memory chip stack includes a stack of packaged memory units, each packaged memory unit comprising a memory chip on an IC substrate. Copper pillars are disposed on the back side of the IC substrate and electrically connected to the base substrate.

Figure 4A:
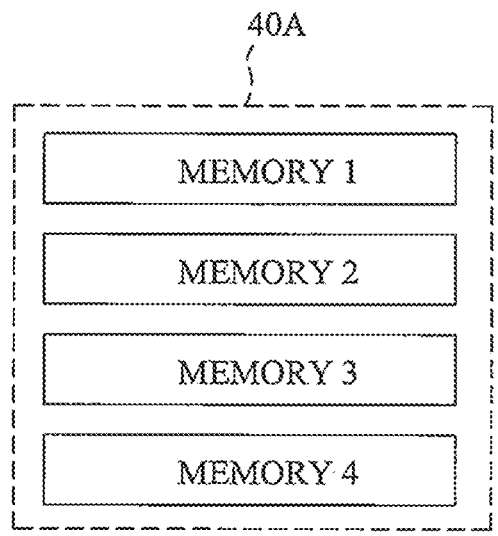
FIG. 4A and FIG. 4B schematically illustrate two stacked memory devices according to embodiments of the present invention.
Figure 4B:
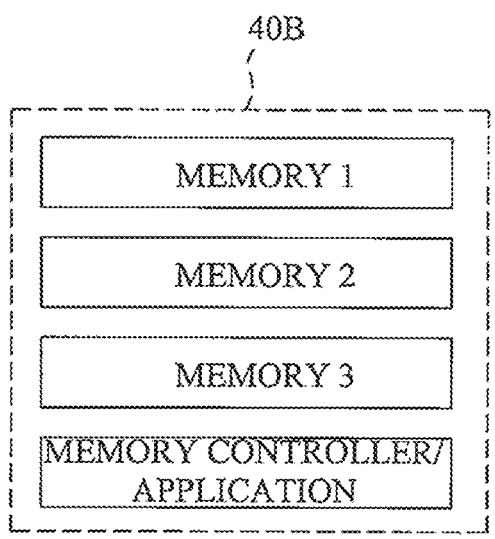

FIG. 4A and FIG. 4B schematically illustrate two stacked memory devices according to embodiments of the present invention. In FIG. 4A, a 3D stacked memory device 40A comprises a plurality of vertically stacked memory packages MEMORY 1-4 which are arranged one on top of another. The 3D stacked memory device 40A can be further packaged with other logical devices such as memory controller or processing application chips. In FIG. 4B, a 3D stacked memory device 40B can include a logical device MEMORY CONTROLLER/APPLICATION packaged with a set of vertically stacked memory packages MEMORY 1-3 which are arranged one on top another.

Figure 5:
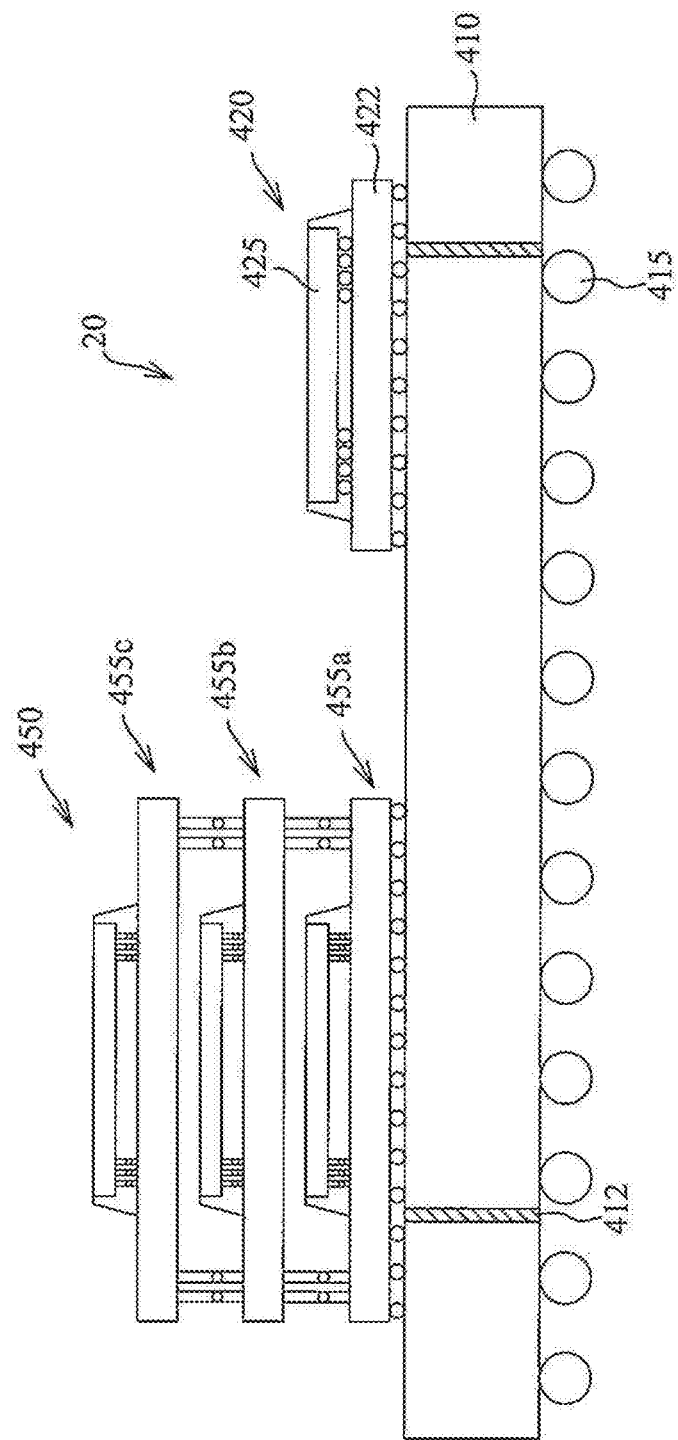
FIG. 5 schematically illustrates another embodiment of the stacked package-on-package memory devices with copper pillars electrically connecting the package units.

FIG. 5 schematically illustrates another embodiment of the stacked package-on-package memory devices with copper pillars electrically connecting the package units. Referring to FIG. 5, a stacked package-on-package memory device 20 comprises a main circuit board 410 with through vias 412 and interconnections therein. A chip scale package 420 with a logic processing chip 425 on a substrate 422 is disposed on the main circuit board 410. A memory chip stack 450 is disposed side-by-side with the logic processing package 420 on the main circuit board 410, wherein the memory chip stack includes a stack of packaged memory units 455a-455c, each packaged memory unit comprising a memory chip on an IC substrate, and wherein copper pillars are disposed on the back side of the IC substrate and electrically connected to the base substrate, as described with respect to one or more of FIGS. 1, 2, 3A, 3B. The logic processing chip 425 preferably includes an application processor and a memory control unit.

The main circuit board 410 further comprises an array of solder balls on the bottom surface of the base substrate. There are additional features not mentioned here, which complete the stacked package-on-package memory device 20.

Embodiments of the present invention are advantageous in that by careful monitoring and controlling of the copper pillar's critical features and physical properties, a high quality, reliable bump structure is achievable. Signals can trace upwardly and downwardly through copper pillar interconnection. Copper pillar stacked PoP memory devices enable a higher I/O pad density architecture. The number of I/O pads generally more than 1000 can be easily achieved in one or more embodiments. By comparison with other 3D memory stacks with TSV connection, production cost can be apparently reduced in one or more embodiments.

FIGS. 6~13 show a fabrication of copper pillars formed on an IC substrate according to one or more embodiments of the present invention. The chip or chips mounted on the substrate is/are omitted in the drawing.

Figure 6:
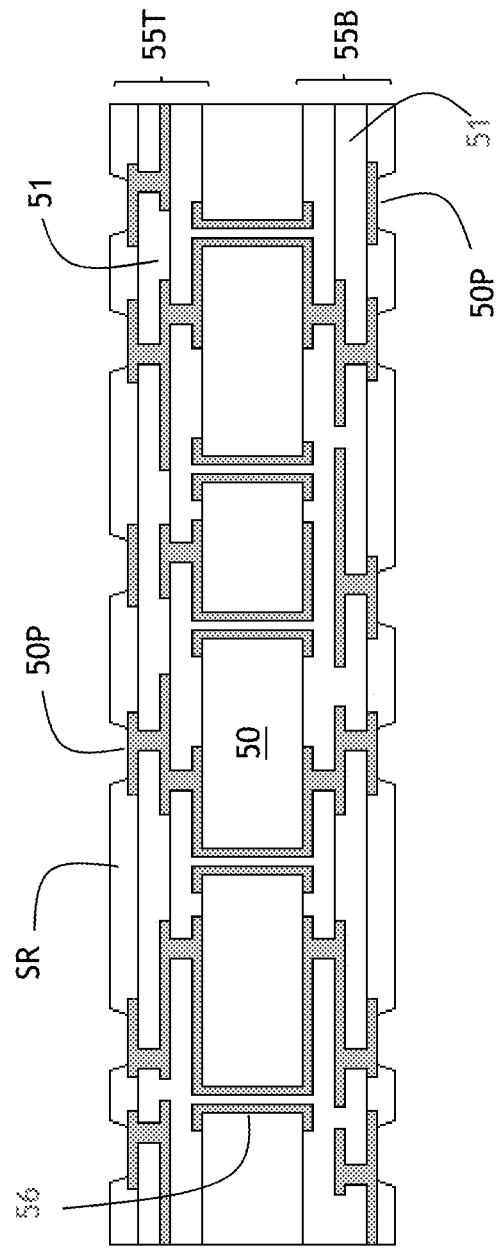
FIGS. 6-13 show a fabrication of copper pillars formed on an IC substrate according to some embodiments of the present invention.

FIG. 6 shows a structure of an IC substrate.

The IC substrate 120 which has a core sheet 50. A top circuitry 55T embedded in dielectric layers 51 such as prepreg or Ajinomoto Build-up film (ABF), is configured on top of the core sheet 50. A bottom circuitry 55B embedded in dielectric layers 51 is configured on bottom of the core sheet 50. A plurality of plated through holes 56 passing through the core sheet 50 electrically couples the top circuitry 55T with the bottom circuitry 55B. A layer of solder resist SR covers the top surface of the top circuitry 55T and a plurality of top metal pad 50P is exposed from the solder resist SR. The top metal pad 50P is configured for a chip or chips 140 to mount thereon.

Figure 7:
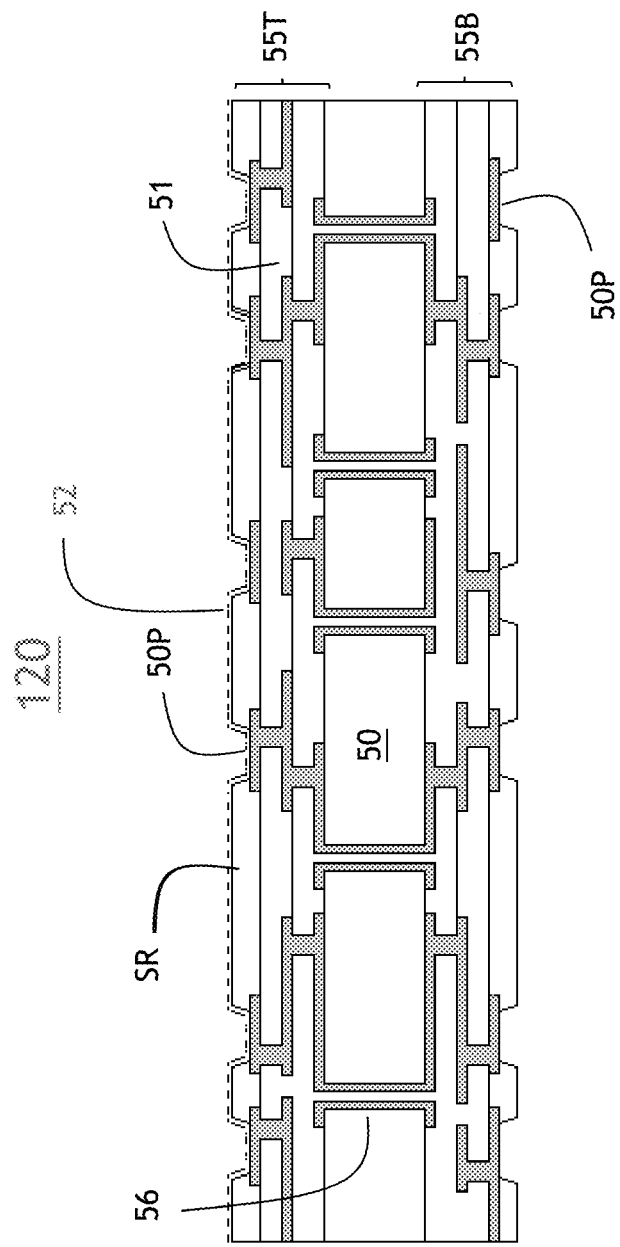

FIG. 7 shows formation of a seed layer.

FIG. 7 shows a seed layer 52, for example Ti or Cu, is applied on a top surface of the IC substrate 120.

Figure 8:
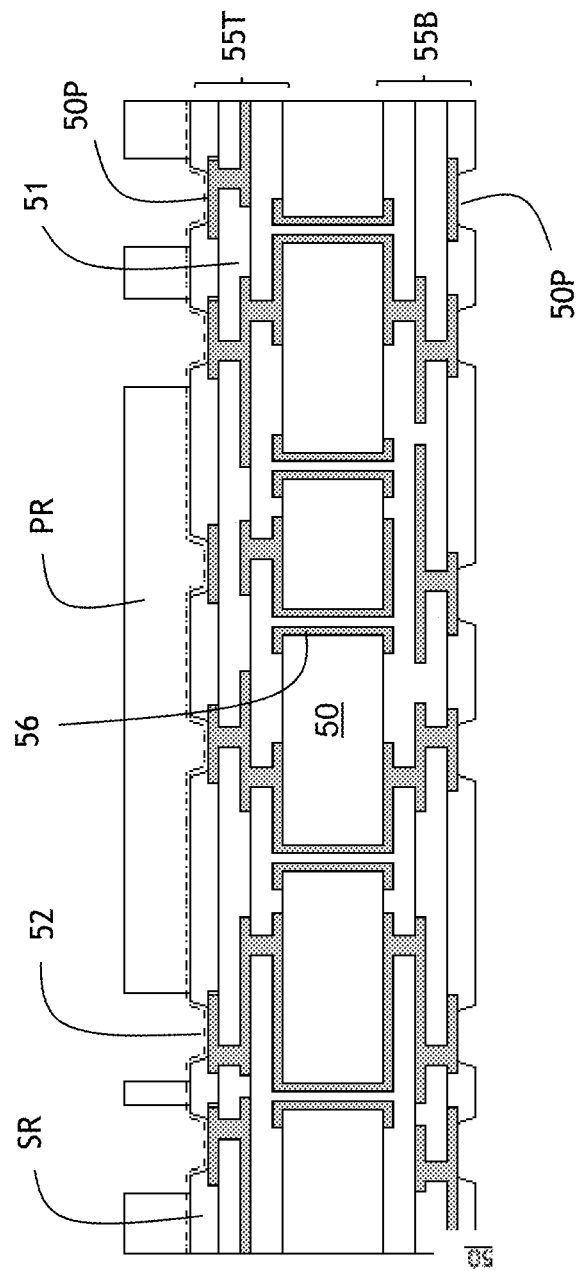

FIG. 8 shows formation of a patterned photo-resist PR.

FIG. 8 shows a patterned photo-resist PR or dry film is applied on top of the seed layer 52.

Figure 9:
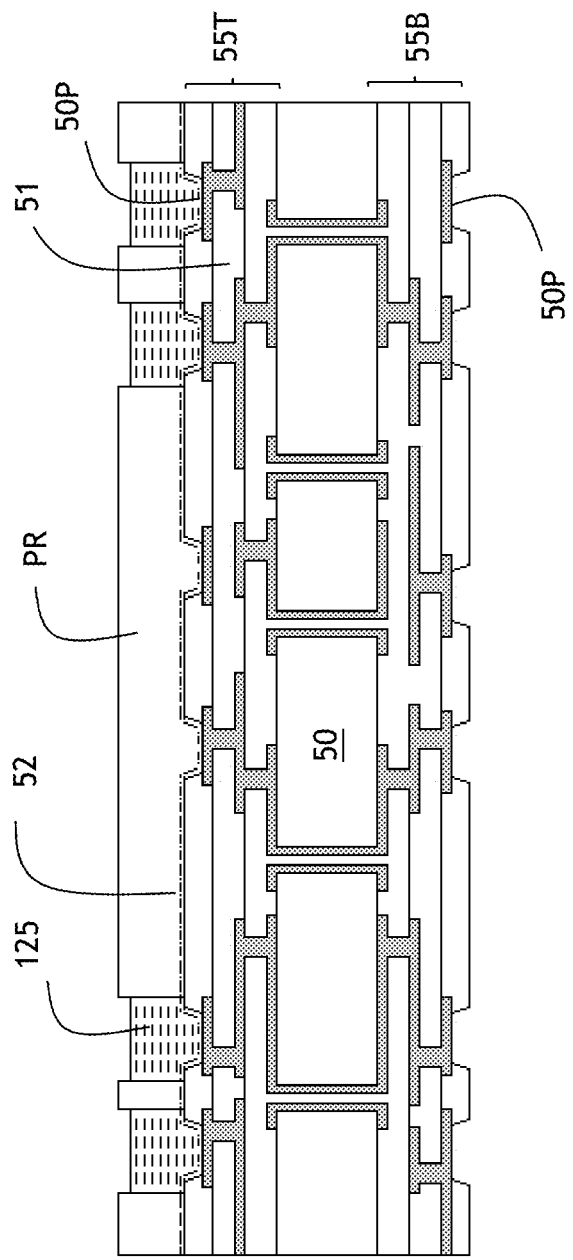

FIG. 9 shows formation of copper pillars.

FIG. 9 shows copper is plated and a plurality of copper pillars 125 are formed at predetermined location.

Figure 10:
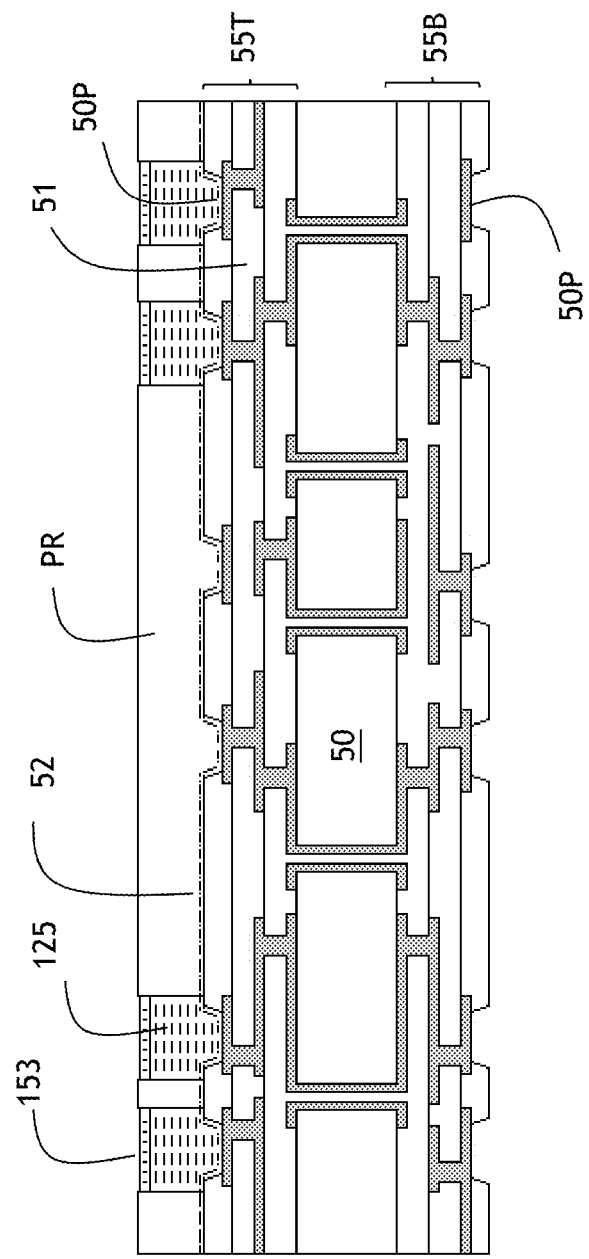

FIG. 10 shows formation of solder.

FIG. 10 shows a layer of solder 153, for example Sn/Ag, is plated on top of the plurality of copper pillars 125.

Figure 11:
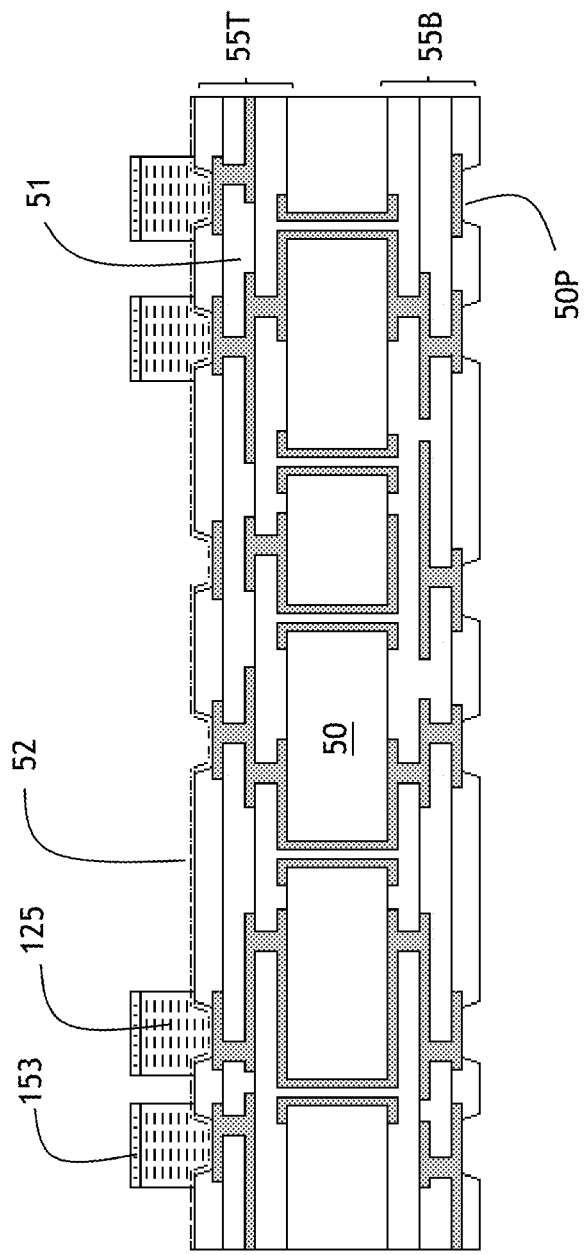

FIG. 11 shows removal of the photo-resist PR.

FIG. 11 shows the photo resist PR is removed and the seed layer 52 is revealed.

Figure 12:
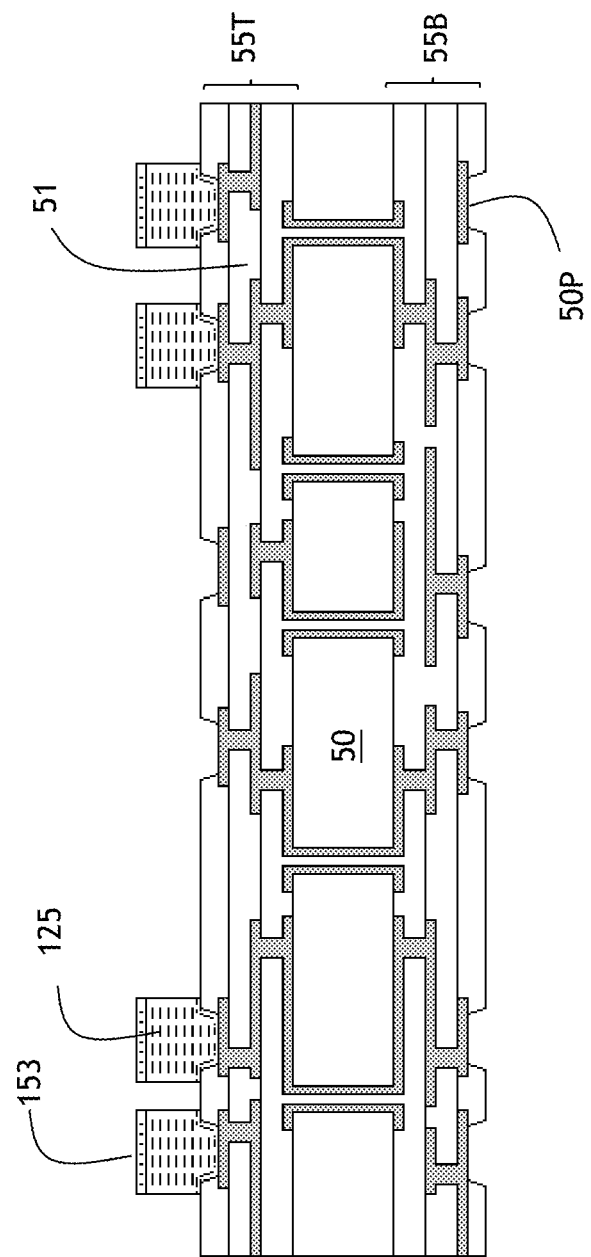

FIG. 12 shows removal of the seed layer is.

FIG. 12 shows the seed layer 52 is removed.

Figure 13:
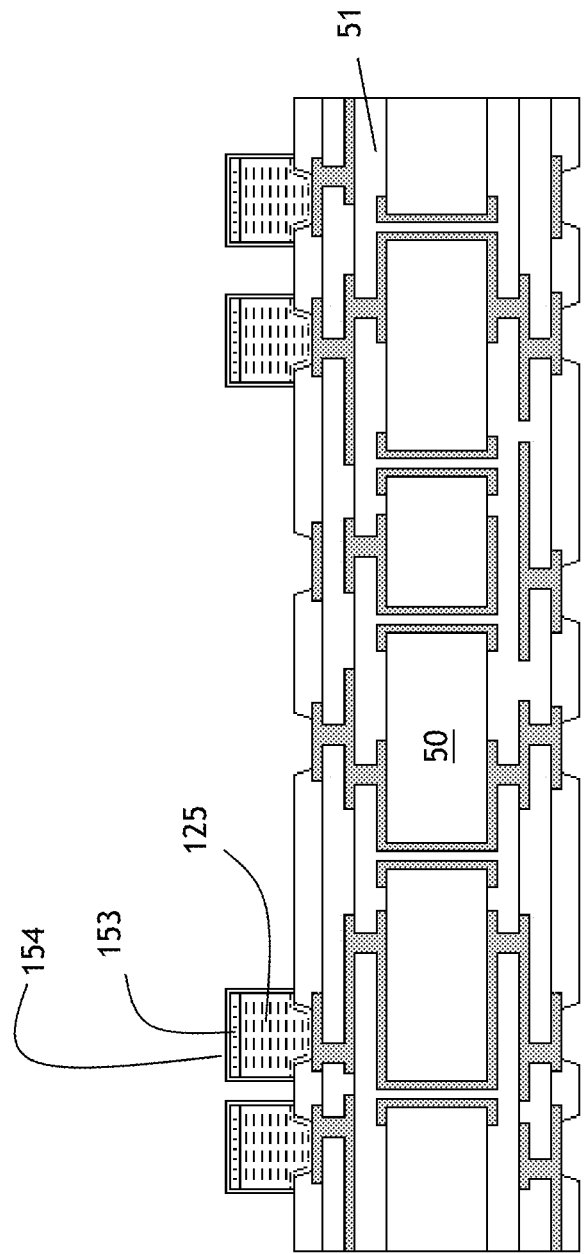

FIG. 13 shows application of a layer of Organic Solderability Preservative.

FIG. 13 shows a layer of Organic Solderability Preservative (OSP) 154 is applied on the surfaces of each copper pillar 125 and the solder 153.

Figure 14:
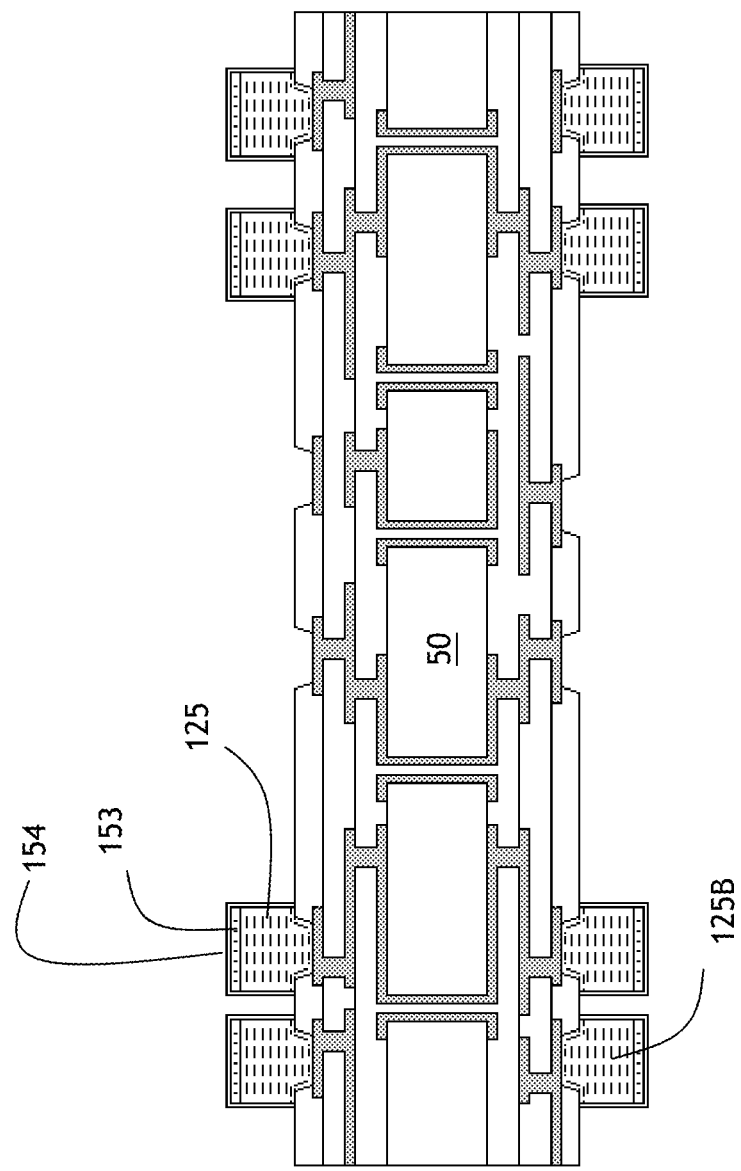
FIG. 14 shows copper pillars formed on bottom of an IC substrate according to some embodiments of the present invention.

FIG. 14 shows formation of copper pillars on bottom of the IC substrate.

FIG. 14 shows a second plurality of copper pillars 125B can be formed on a bottom of the substrate 120 using similar fabrication processes.

Figure 15:
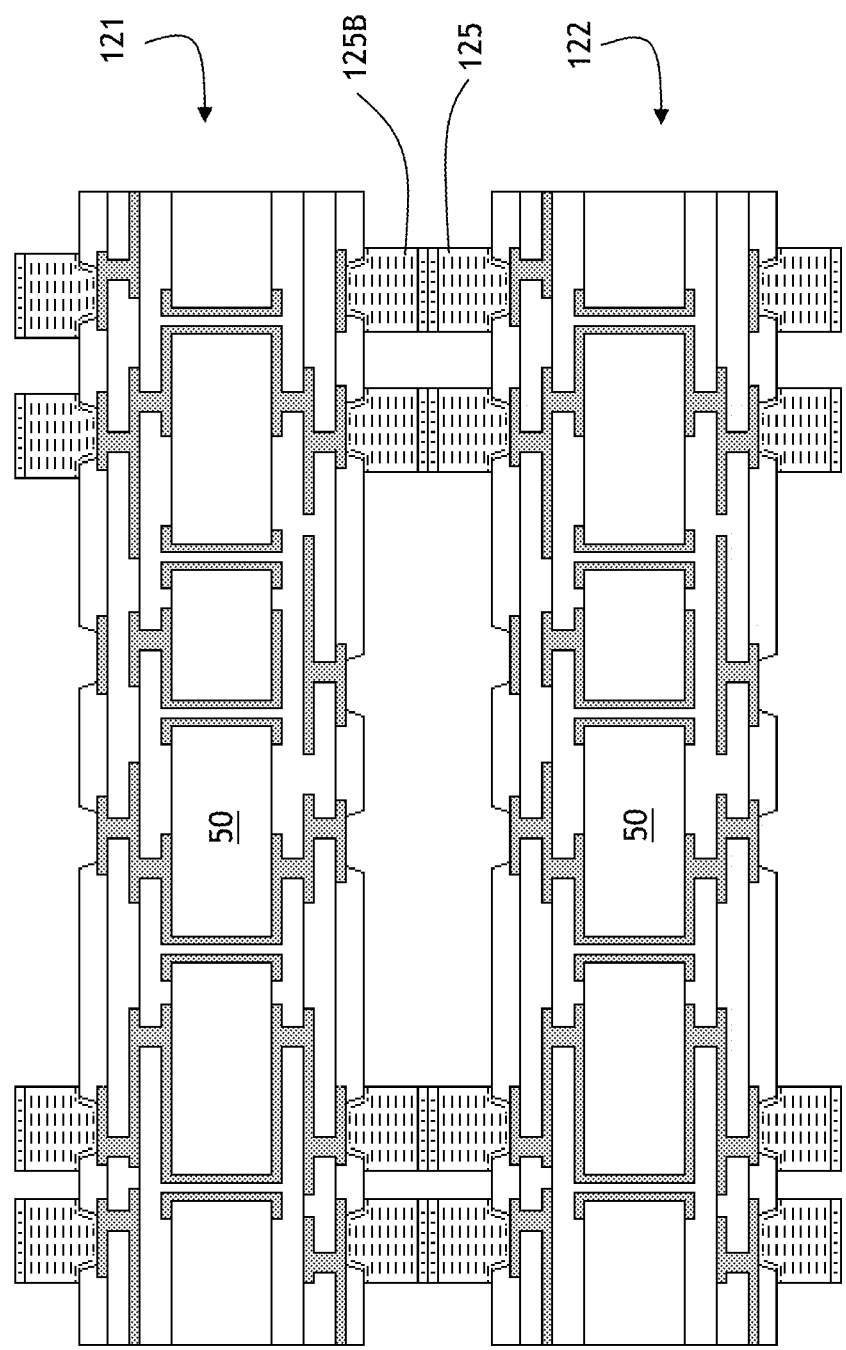
FIG. 15 shows two IC substrates stacked on top each other according to some embodiments of the present invention.

FIG. 15 shows stacking of two IC substrates.

FIG. 15 shows two IC substrates 121, 122 are staked one on top another. Each of the IC substrates 121, 122 corresponds to the IC substrate described in FIG. 14. A first IC substrate 121 having a first plurality of copper pillars 125B configured on bottom. A second IC substrate 122 having a second plurality of copper pillars 125 configured on top. The first IC substrate 121 is stacked on top of the second IC substrate 122, wherein the first plurality of copper pillars 125B are each connected to a corresponding one of the second plurality of copper pillars 125 so that the circuitry of the first IC substrate 121 is electrically coupled with the circuitry of the second IC substrate 122.

A memory module can be formed, in one or more embodiments, as the stacked structure of FIG. 2 in the manner described with respect to FIGS. 6-15.

While the invention has been described by way of examples and in terms of preferred embodiments, it would be apparent to those skilled in the art to make various equivalent replacements, amendments and modifications in view of specification of the invention. Therefore, the scope of the appended claims should be accorded the broadest interpretation so as to encompass all such replacements, amendments and modifications without departing from the spirit and scope of the invention.

What is claimed is:

1. A stacked IC package, comprising:
   a first substrate;
   a first top circuitry on a top surface of the first substrate;
   a first plurality of top copper pillars extending upward from the first top circuitry on the top surface of the first substrate and electrically coupled to the first top circuitry;
   a first bottom circuitry on a bottom surface of the first substrate, the first bottom circuitry electrically coupled to the first top circuitry; and
   a first plurality of bottom copper pillars extending downward from the first bottom circuitry on the bottom surface of the first substrate and electrically coupled to the first bottom circuitry.

2. A stacked IC package as claimed in claim 1, further comprising:
   a second substrate;
   a second bottom circuitry on a bottom surface of the second substrate; and
   a second plurality of bottom copper pillars extending downward from the second bottom circuitry on the bottom surface of the second substrate and electrically coupled to the second bottom circuitry;
   wherein
   the second substrate is stacked on top of the first substrate, and the second plurality of bottom copper pillars are each electrically and physically coupled to a corresponding one of the first plurality of top copper pillars.

3. A stacked IC package, comprising:
a first substrate;
a first top circuitry configured on top of the first substrate;
a first plurality of top copper pillars configured on top of the first substrate and electrically coupled to the first top circuitry;
a second substrate;
a second bottom circuitry configured on bottom of the second substrate;
a second plurality of bottom copper pillars configured on bottom of the second substrate and electrically coupled to the second bottom circuitry;
a second top circuitry configured on top of the second substrate; and
a second plurality of top copper pillars configured on top of the second substrate and electrically coupled to the second top circuitry,
wherein
the second substrate is stacked on top of the first substrate, and
the second plurality of bottom copper pillars are each electrically and physically coupled to a corresponding one of the first plurality of top copper pillars.

4. A stacked IC package as claimed in claim 3, further comprising:
a first chip configured on top of the first substrate;
a second chip configured on top of the second substrate;
wherein
one of the first chip and the second chip is a memory chip; and
the other of the first chip and the second chip is a controller chip configured to control the memory chip.

5. A stacked IC package as claimed in claim 4, wherein the first chip is arranged between the first substrate and the second substrate.

6. A stacked IC package as claimed in claim 3, further comprising:
a third substrate;
a third bottom circuitry configured on bottom of the third substrate; and
a third plurality of bottom copper pillars configured on bottom of the third substrate and electrically coupled to the third bottom circuitry;
wherein
the third substrate is stacked on top of the second substrate, and
the third plurality of bottom copper pillars are each electrically and physically coupled to a corresponding one of the second plurality of top copper pillars.

7. A stacked IC package as claimed in claim 6, further comprising:
a first chip configured on top of the first substrate;
a second chip configured on top of the second substrate; and
a third chip configured on top of the third substrate;
wherein
at least one of the first chip, the second chip and the third chip is a memory chip; and
another one of the first chip, the second chip and the third chip is a controller chip configured to control the memory chip.

8. A stacked IC package as claimed in claim 7, wherein the third chip and the second chip are memory chips; and the first is the controller chip configured to control the memory chips.

9. A stacked IC package as claimed in claim 7, wherein the first chip is arranged between the first substrate and the second substrate, and
the second chip is arranged between the second substrate and the third substrate.

10. A memory module package, comprising:
a first substrate;
a first top circuitry configured on top of the first substrate;
a first plurality of top copper pillars configured on top of the first substrate and electrically coupled to the first top circuitry;
a controller chip configured on top of the first substrate and electrically coupled to the first top circuitry;
a second substrate;
a second bottom circuitry configured on bottom of the second substrate;
a second plurality of bottom copper pillars configured on bottom of the second substrate and electrically coupled to the second bottom circuitry; and
a first memory chip configured on top of the second substrate;
wherein
the second substrate is stacked on top of the first substrate, and
the second plurality of bottom copper pillars are each electrically and physically coupled to a corresponding one of the first plurality of top copper pillars.

11. A memory module package as claimed in claim 10, further comprising:
a second top circuitry configured on top of the second substrate and electrically coupled to the first memory chip;
a second plurality of top copper pillars configured on top of the second substrate and electrically coupled to the second top circuitry;
a third substrate;
a third bottom circuitry configured on bottom of the third substrate; and
a third plurality of bottom copper pillars configured on bottom of the third substrate and electrically coupled to the third bottom circuitry;
wherein
the third substrate is stacked on top of the second substrate, and
the third plurality of bottom copper pillars are each electrically and physically coupled to a corresponding one of the second plurality of top copper pillars.

12. A memory module package as claimed in claim 11, further comprising:
a second memory chip configured on top of the third substrate.

13. A memory module package as claimed in claim 12, wherein
the controller chip is arranged between the first substrate and the second substrate, and
the first memory chip is arranged between the second substrate and the third substrate.

14. A memory module package as claimed in claim 13, wherein
the second bottom circuitry is electrically coupled to the second top circuitry by first plated through holes in the second substrate, and
the third bottom circuitry is electrically coupled to the second memory chip by second plated through holes in the third substrate.

15. A stacked IC package as claimed in claim 1, further comprising:
   a first top dielectric layer on the top surface of the first substrate, the first top circuitry embedded in the first top dielectric layer; and
   a first bottom dielectric layer on the bottom surface of the first substrate, the first bottom circuitry embedded in the first bottom dielectric layer.

16. A stacked IC package as claimed in claim 15, further comprising:
   a top solder resist layer over the first top circuitry; and
   a bottom solder resist layer under the first bottom circuitry,
   wherein
   the first top circuitry has an uppermost conductive layer at a top surface of the first top dielectric layer, the uppermost conductive layer including a plurality of top conductive pads, and
   the first bottom circuitry has a lowermost conductive layer at a bottom surface of the first bottom dielectric layer, the lowermost conductive layer including a plurality of bottom conductive pads,
   the top solder resist layer covers the top surface of the first top dielectric layer, while exposing the plurality of top conductive pads, and
   the bottom solder resist layer covers the bottom surface of the first bottom dielectric layer, while exposing the plurality of bottom conductive pads.

17. A stacked IC package as claimed in claim 16, further comprising:
   a top solder layer on a top surface of each top copper pillar among the first plurality of top copper pillars; and
   a bottom solder layer on a bottom surface of each bottom copper pillar among the first plurality of bottom copper pillars,
   wherein
   each top copper pillar among the first plurality of top copper pillars extends upward from a corresponding top conductive pad among the plurality of top conductive pads, and
   each bottom copper pillar among the first plurality of bottom copper pillars extends downward from a corresponding bottom conductive pad among the plurality of bottom conductive pads.

18. A stacked IC package as claimed in claim 17, further comprising:
   a top layer of Organic Solderability Preservative (OSP) covering the top solder layer on the top surface of each top copper pillar among the first plurality of top copper pillars; and
   a bottom layer of OSP covering the bottom solder layer on the bottom surface of each bottom copper pillar among the first plurality of bottom copper pillars.

19. A stacked IC package as claimed in claim 17, wherein
   the plurality of top conductive pads includes at least one top conductive pad not covered by any top copper pillar among the first plurality of top copper pillars, and
   the plurality of bottom conductive pads includes at least one bottom conductive pad not covered by any bottom copper pillar among the first plurality of bottom copper pillars.

20. A stacked IC package as claimed in claim 19, wherein, in a cross-section view of the stacked IC package,
   the first plurality of top copper pillars is arranged on opposite sides of said at least one top conductive pad, and
   the first plurality of bottom copper pillars is arranged on opposite sides of said at least one bottom conductive pad.

* * * * *